United States Patent
Bindra et al.

(10) Patent No.: US 11,201,610 B2
(45) Date of Patent: *Dec. 14, 2021

(54) SELECTABLE DELAY BUFFERS AND LOGIC CELLS FOR DYNAMIC VOLTAGE SCALING IN ULTRA LOW VOLTAGE DESIGNS

(71) Applicant: Taiwan Semiconductor Manufacturing Company Limited, Hsinchu (TW)

(72) Inventors: Jaskirat Bindra, San Jose, CA (US); Kumar Lalgudi, Fremont, CA (US)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/065,660

(22) Filed: Oct. 8, 2020

(65) Prior Publication Data

US 2021/0028776 A1 Jan. 28, 2021

Related U.S. Application Data

(60) Continuation of application No. 16/590,849, filed on Oct. 2, 2019, now Pat. No. 10,819,325, which is a division of application No. 15/296,603, filed on Oct. 18, 2016, now Pat. No. 10,476,490.

(51) Int. Cl.
*H03K 5/13* (2014.01)
*H03K 5/00* (2006.01)

(52) U.S. Cl.
CPC ..... *H03K 5/13* (2013.01); *H03K 2005/00019* (2013.01); *H03K 2005/00078* (2013.01)

(58) Field of Classification Search
CPC ..... H03K 5/13–14; H03K 2005/00019; H03K 2005/00078
See application file for complete search history.

(56) References Cited

U.S. PATENT DOCUMENTS

| | | | |
|---|---|---|---|
| 6,204,710 B1 | 3/2001 | Goetting et al. | |
| 6,335,885 B1 | 1/2002 | Shimizu | |
| 7,437,580 B2 | 10/2008 | Henderson et al. | |
| 7,622,979 B2 | 11/2009 | Bhatia et al. | |
| 7,893,739 B1 | 2/2011 | Nagarajan et al. | |
| 8,179,181 B2 | 5/2012 | Lung et al. | |
| 9,065,439 B2 | 6/2015 | Sharma et al. | |
| 9,477,258 B2 | 10/2016 | Nieh et al. | |
| 10,476,490 B2 | 11/2019 | Bindra et al. | |
| 10,819,325 B2 * | 10/2020 | Bindra | H03K 5/13 |
| 2006/0132210 A1 | 6/2006 | Kong et al. | |
| 2016/0043707 A1 | 2/2016 | Bhatia | |

* cited by examiner

*Primary Examiner* — Patrick O Neill
(74) *Attorney, Agent, or Firm* — Jones Day (57) ABSTRACT

Provided is a selectable delay buffer for tuning a delay path in a circuit. The selectable delay buffer comprises a first delay segment configured to pass an input signal to an output terminal within a first range of time delays, a second delay segment configured to pass the input signal to the output terminal within a second range of time delays that is different from the first range, and a segment selection switch configured to selectively couple the delay segments to the output terminal based on received selection information that indicates which delay segment to couple to the output terminal.

20 Claims, 9 Drawing Sheets

SELECTABLE DELAY BUFFERS AND LOGIC CELLS FOR DYNAMIC VOLTAGE SCALING IN ULTRA LOW VOLTAGE DESIGNS

CROSS-REFERENCE TO RELATED APPLICATION

This application is a continuation of U.S. patent application Ser. No. 16/590,849, filed Oct. 2, 2019, which is a divisional of U.S. patent application Ser. No. 15/296,603, filed Oct. 18, 2016, the contents of which is incorporated herein by reference in its entirety.

BACKGROUND

The technology described in this patent document relates generally to circuit design and more specifically to a delay buffer configured for operation with a plurality of voltage and/or frequency ranges.

Improvements in circuit design techniques has enabled continued improvement in ultra low voltage applications. Development of improved circuit elements can further improve ultra low voltage circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
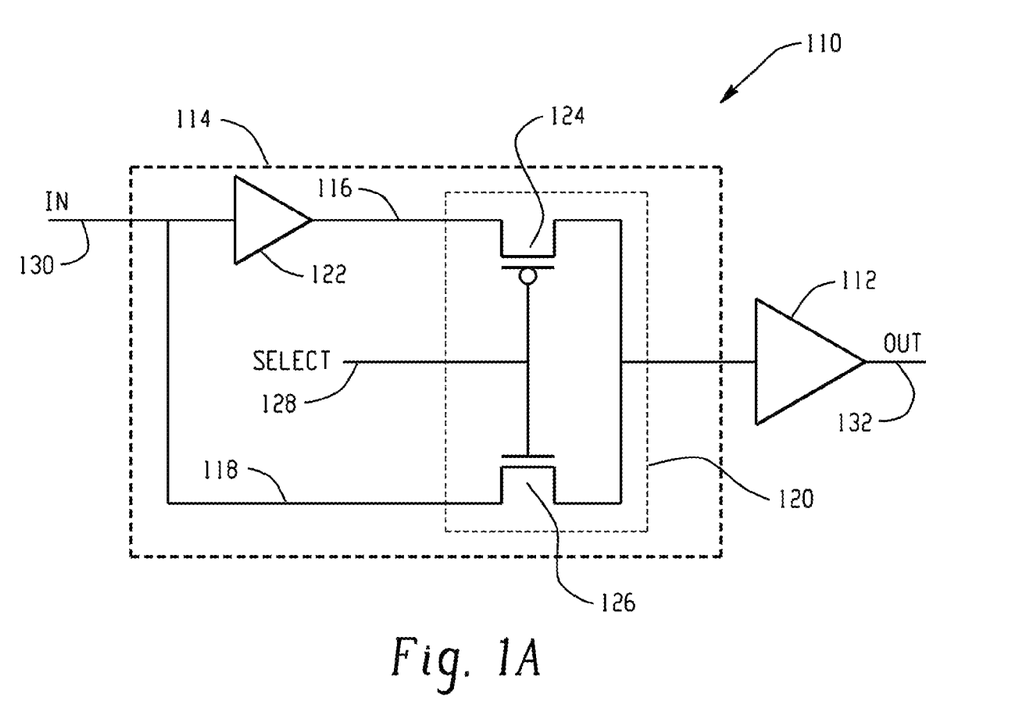
FIG. 1A is a schematic diagram of an example selectable delay buffer, in accordance with some embodiments.

FIG. 1A is a schematic diagram of an example selectable delay buffer 110. The selectable delay buffer 110 may be used in an electronic circuit such as a synchronous logic circuit to assist in tuning a delay path for a clock or data signal. The example selectable delay buffer 110 includes a fixed delay section 112 and an adjustable delay section 114. The fixed delay section 112 comprises a delay element such as a buffer driver that provides a minimum fixed delay for a signal passing thru the example selectable delay buffer 110 when operating at a particular voltage level. The fixed delay however may be different if operating at a different voltage level.

The example adjustable delay section 114 includes a first delay segment 116, a second delay segment 118, and a segment selection switch 120. The first delay segment 116 in this example includes a conduction path and a delay element 122 such as a buffer driver that provides a time delay range at a particular voltage level for a signal passing thru the first delay segment 116. The time delay range is bounded by a $t_{min}$ and a $t_{max}$. The second delay segment 118 in this example includes a conduction path that provides negligible delay for a signal passing thru the delay segment 118. The second delay segment 118 also includes a time delay range that is bounded by a $t_{min}$ and a $t_{max}$, which is different from the time delay range for the first delay segment 116. The segment selection switch 120 selectively couples the first delay segment 116 and the second delay segment 118 one at a time to the input of the fixed delay section 112.

In this example, the segment selection switch 120 comprises two pass gates, a PMOS FET 124 and an NMOS FET 126, with their respective input terminals connected to the first delay segment 116 and the second delay segment 118 and their output terminals coupled together at the input to the fixed delay section 112. The pass gates 124, 126 are each enabled by selection information provided via a select signal applied to a selection input terminal 128 coupled to the gates of the pass gates 124, 126. The selection information indicates which of the first and second delay segments 116, 118 to couple to the fixed delay section 112. In this example, when the selection information indicates a logic zero level, the PMOS pass gate 124 is enabled to couple the first delay segment 116 to the input of the fixed delay section 112. This causes the time delay for the selectable delay buffer 110 to essentially be equal to the time delay range provided by the fixed delay section 112 plus the time delay range provided by the first delay segment 116. When the selection information indicates a logic one level, the NMOS pass gate 126 is enabled to couple the second delay segment 118 to the input of the fixed delay section 112. This causes the time delay for the selectable delay buffer 110 to essentially be equal to the time delay range provided by the fixed delay section 112 plus the time delay range provided by the second delay segment 118.

Figure 1B:
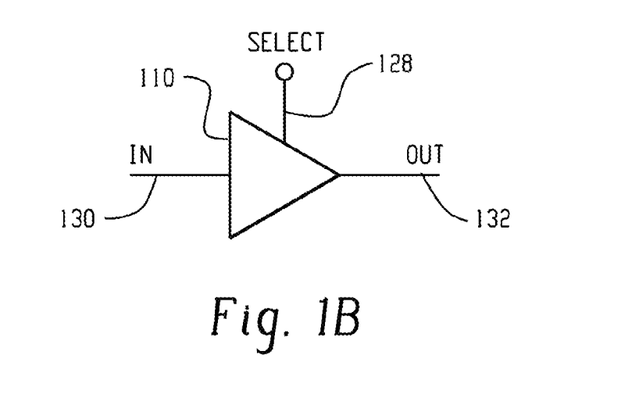
FIG. 1B is an alternate schematic representation of the selectable delay buffer 110 illustrating the signal input terminal 130, the signal output terminal 132, and the selection input terminal 128, in accordance with some embodiments.

In addition to the selection input terminal 128, the selectable delay buffer 110 includes a signal input terminal 130 and a signal output terminal 132. The selectable delay buffer 110 may be used in data signal paths and clock signal paths in a synchronous logic circuit to produce at the output terminal 132 a delayed version of the signal provided at the input terminal 130. Depicted in FIG. 1B is an alternate schematic representation of the selectable delay buffer 110 illustrating the signal input terminal 130, the signal output terminal 132, and the selection input terminal 128.

The selectable delay buffer 110 may be operated to provide one delay range when operating at a first voltage level and a different delay range when operating at a second voltage level. This can be accomplished by selecting one of the delay segments when operating at a first voltage level and another delay segment when operating at a second voltage level.

Figure 2A:
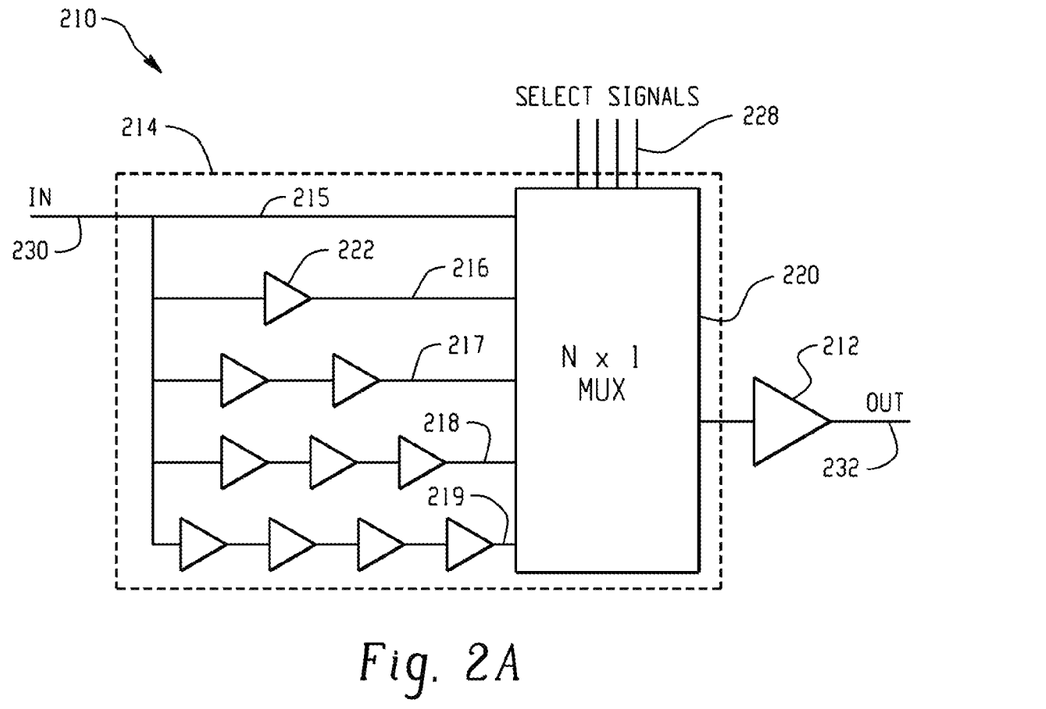
FIG. 2A is a schematic diagram of another example selectable delay buffer, in accordance with some embodiments.

FIG. 2A is a schematic diagram of another example selectable delay buffer 210. The selectable delay buffer 210 may be used in an electronic circuit such as a synchronous logic circuit to assist in tuning a delay path for a clock or data signal. The example selectable delay buffer 210 includes a fixed delay section 212 and an adjustable delay section 214. The fixed delay section 212 comprises a delay element such as a buffer driver that provides a minimum fixed delay for a signal passing thru the example selectable delay buffer 210 when operating at a particular voltage level. The fixed delay however may be different if operating at a different voltage level.

The example adjustable delay section 214 includes a first delay segment 215, a second delay segment 216, a third delay segment 217, a fourth delay segment 218, a fifth delay segment 219, and a segment selection switch 220. The first delay segment 215 in this example comprises a conduction path. The second delay segment 216 comprises a conduction path and a delay element such as a buffer driver that provides a time delay range at a particular voltage level for a signal passing thru the delay segment. The third delay segment 217 comprises a conduction path and two delay elements. The fourth delay segment 218 comprises a conduction path and three delay elements. The fourth delay segment 219 comprises a conduction path and four delay elements. The time delay range for each delay segment is bounded by a unique $t_{min}$ and $t_{max}$ that is different from the time delay range for another delay segment. The segment selection switch 220 selectively couples the delay segments 215, 216, 217, 218, 219 one at a time to the input of the fixed delay section 212, based on received selection information that indicates which delay segment to couple to the fixed delay section 212 and ultimately to the output terminal 232.

The segment selection switch 220 comprises a N×1 multiplexer wherein N is equal to 5 in this example. The N×1 multiplexer 220 is controlled by selection information provided via a select signal applied to the selection input terminals 228. The selection information indicates which of the delay segments 215, 216, 217, 218, 219 to couple to the fixed delay section 212. In this example, the selection information comprises three signals applied to the selection input terminals 228. When the selection information indicates a particular delay segment, that delay segment is coupled to the input of the fixed delay section 212. This causes the time delay for the selectable delay buffer 210 to essentially be equal to the time delay range provided by the fixed delay section 212 plus the time delay range provided by the selected delay segment.

Figure 2B:
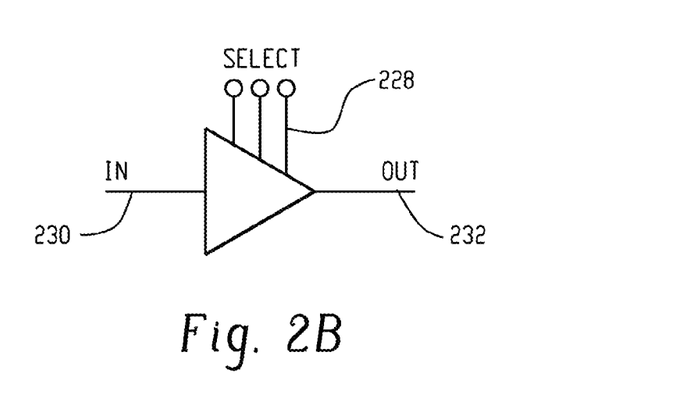
FIG. 2B is an alternate schematic representation of the selectable delay buffer 210 illustrating the selection input terminal 230, the signal output terminal 232, and the selection input terminal 228, in accordance with some embodiments.

In addition to the selection input terminal 228, the selectable delay buffer 210 includes a signal input terminal 230 and a signal output terminal 232. The selectable delay buffer 210 may be used in data signal paths and clock signal paths in a synchronous logic circuit to produce at the output terminal 232 a delayed version of the signal provided at the input terminal 230. Depicted in FIG. 2B is an alternate schematic representation of the selectable delay buffer 210 illustrating the signal input terminal 230, the signal output terminal 232, and the selection input terminal 228.

The selectable delay buffer 210 may be operated to provide a unique delay range for five different voltage levels. This can be accomplished by selecting one of the delay segments when operating at a first voltage level, a second of the delay segments when operating at a second voltage level, a third of the delay segments when operating at a third voltage level, a fourth of the delay segments when operating at a fourth voltage level, and a fifth of the delay segments when operating at a fifth voltage level.

Figure 3A:
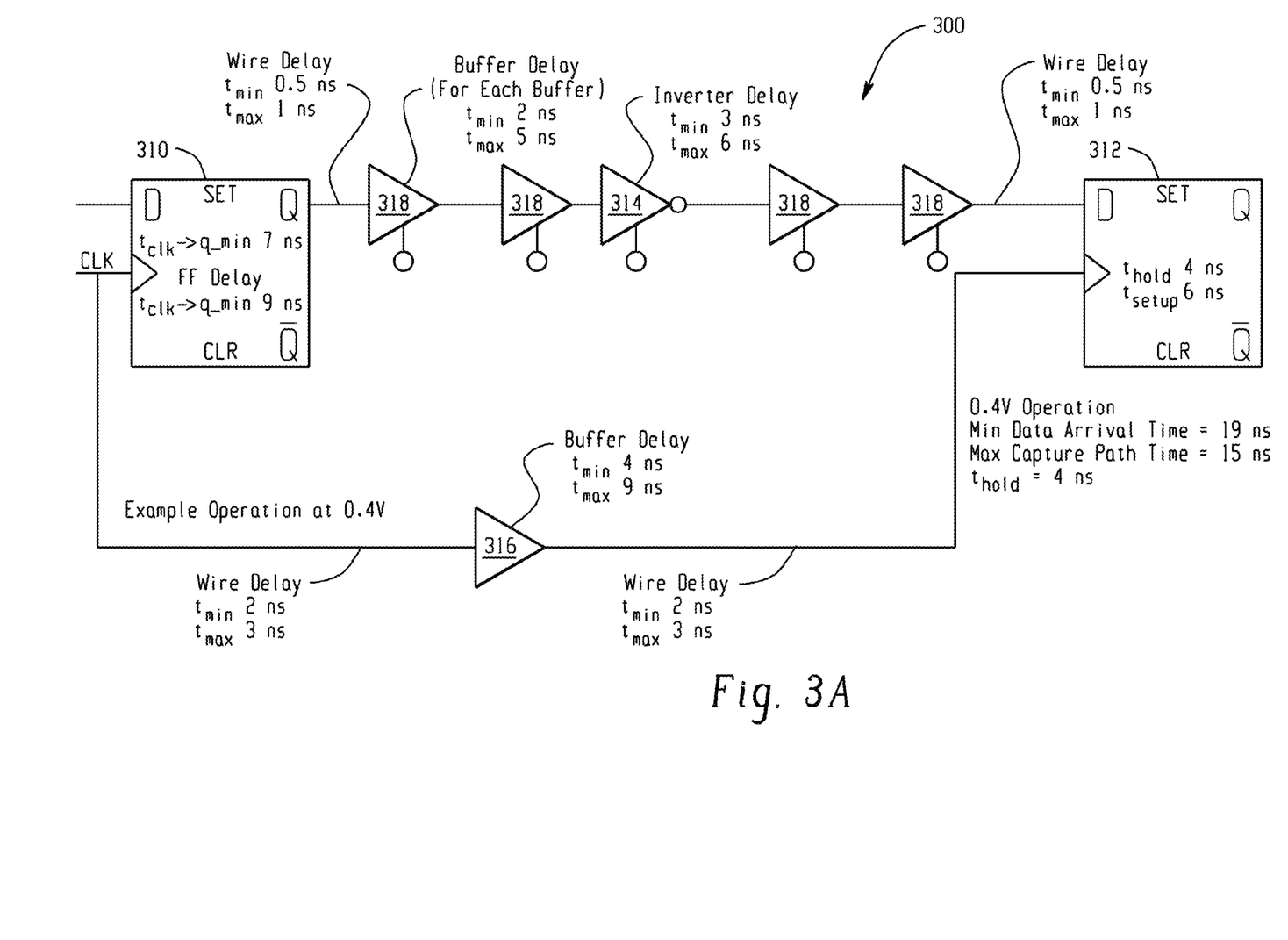
FIGS. 3A and 3B are schematic diagrams of an example synchronous VLSI logic circuit that utilize selectable delay buffers, in accordance with some embodiments.
Figure 3B:
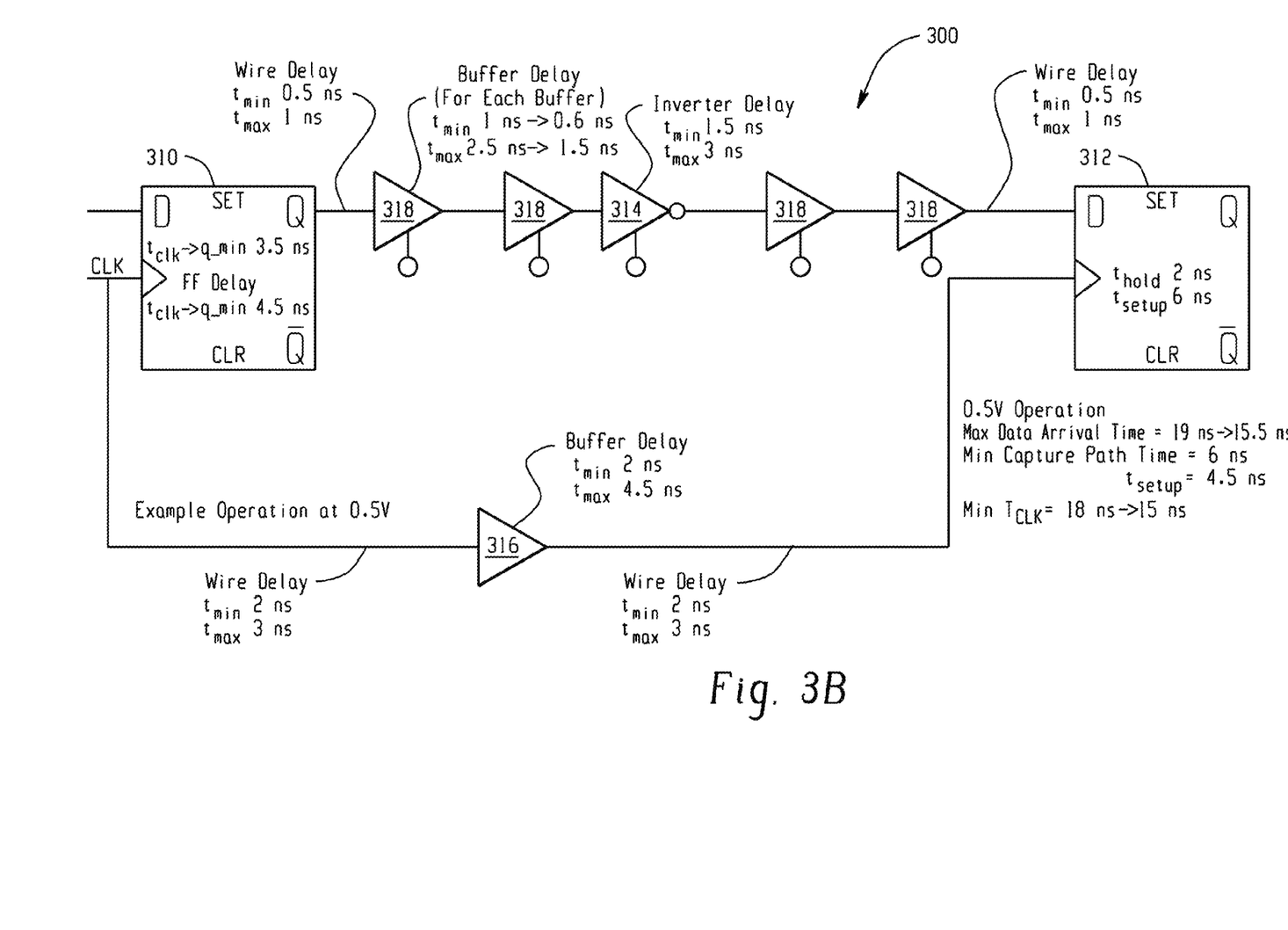

FIGS. 3A and 3B are schematic diagrams of an example synchronous VLSI logic circuit 300. The circuit includes a first memory element, flip flop 310, and a second memory element, flip flop 312, with a data path and a clock path coupled between them. The data path includes an inverter 314 for inverting the output of the first memory element 310 before it is stored in the second memory element 312. The clock path includes a buffer 316 for buffering a clock signal that is used by the first and second memory elements to synchronize the storage and output of data.

To ensure the logic circuit 300 functions correctly, the data path and/or clock path may need delay buffers inserted therein to correct for potential hold time violations. The example logic circuit 300 may be employed in various IoT ("internet of things") and automotive products. Such an application may employ an ultra low voltage (ULV) design along with a dynamic voltage scaling (DVS) technique. Because the example logic circuit 300 may employ DVS usage, the circuit may need to operate correctly at multiple operating voltages. The example logic circuit 300 includes selectable delay buffers 318 which allow for the correction of potential hold time violations when operating at different ULV levels.

The design sign off condition for a circuit could be determined by the lowest operating voltage. A circuit signed off at low voltage, however, when operated at a higher voltage could be over designed for maximum delay paths and under designed for minimum delay paths. For example, the use of a number of buffers to correct hold violations at a lower voltage such as 0.4V could limit the maximum operating frequency at the higher voltage such as 0.5V. For minimum delay paths, the delay buffers used at 0.4V may not provide sufficient delays at higher operation voltage such as 0.5V. The selectable delay buffers 318 used in the example logic circuit 300 allow for the correction of potential hold time violations when operating at different ULV levels so that the circuit is not over designed for maximum delay paths or under designed for minimum delay paths. This can provide significant power performance area (PPA) benefit for IoT/automotive applications. Use of the selectable delay buffers 318 in ultra low voltage designs employed in a dynamic voltage scaling environment provides the ability to intrinsically tune the delays of data and clock paths as a function of the operating voltage. This allows for setup and hold critical timing paths to be optimized for multiple voltage regimes.

The examples in FIGS. 3A and 3B illustrate how the selectable delay buffers 318 may be used for tuning maximum delay paths. FIG. 3A provides example minimum and maximum timing characteristics of the circuit operating at 0.4V when a first delay segment of the selectable delay buffer 318 is selected. In this example, the $t_{hold}$ for the second flip flop is 4 ns and the maximum capture path time for the clock path is 15 ns. Thus, four delay buffers 318 with $t_{min}$ of 2 ns are used to set the minimum data arrival time in the data path to 19 ns to ensure correct circuit operation. As illustrated in FIG. 3B, the same circuit 300 operated at 0.5V may have different timing characteristics. In this example, the $t_{setup}$ for the second flip flop is 4.5 ns and the minimum capture path time for the clock path is 6 ns. The maximum data arrival time in the data path using the four delay buffers 318 with the first delay segment selected would be 19.5 ns yielding a minimum $T_{CLK}$ of 18 ns for the system clock. By using the second delay segment in the four delay buffers 318, in this example, $t_{max}$ for each delay buffer drops to 1.5 ns, the maximum data arrival time in the data path using the four delay buffers 318 with the second delay segment selected would be 15.5 ns yielding a minimum $T_{CLK}$ of 14 ns for the system clock. Thus, higher maximum clock frequencies may be employed at the higher 0.5V operating voltage level because shorter delay paths may be employed in the delay buffers 318.

Figure 4A:
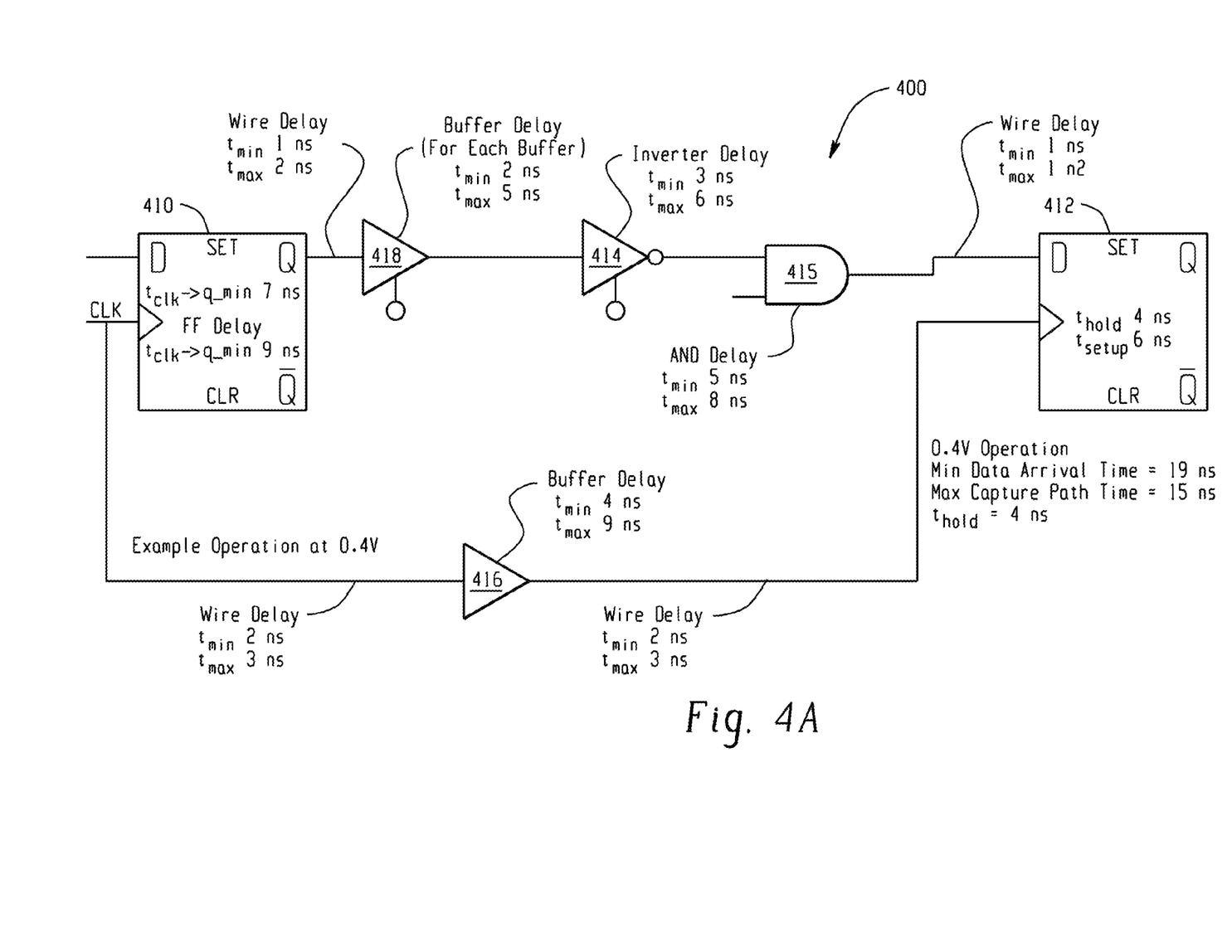
FIGS. 4A and 4B are schematic diagrams of another example synchronous VLSI logic circuit that utilizes a selectable delay buffer, in accordance with some embodiments.
Figure 4B:
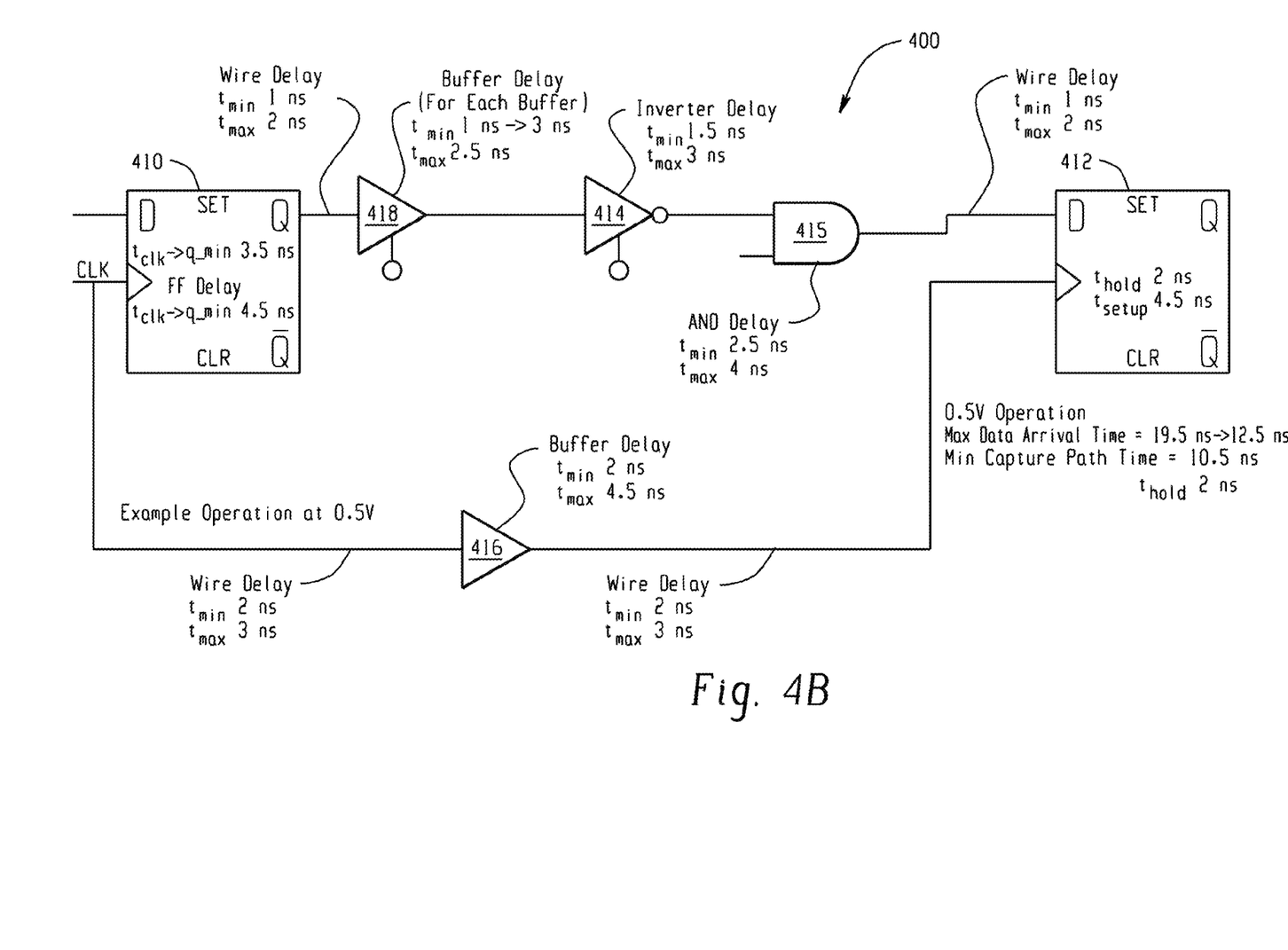

As another example, FIGS. 4A and 4B illustrate how selectable delay buffers may be used for tuning minimum delay paths. FIGS. 4A and 4B are schematic diagrams of another example synchronous VLSI logic circuit 400. The circuit includes a first memory element, flip flop 410, and a second memory element, flip flop 412, with a data path and a clock path coupled between them. The data path includes an inverter 414 and an AND gate 415 for processing the output of the first memory element 410 before it is stored in the second memory element 412. The clock path includes a buffer 416 for buffering a clock signal that is used by the first and second memory elements to synchronize the storage and output of data. The example logic circuit 400 includes a selectable delay buffer 418 that allows for the correction of potential hold time violations when operating at different ULV levels.

The examples in FIGS. 4A and 4B illustrate how the selectable delay buffers 418 may be used for tuning minimum delay paths. FIG. 4A provides example minimum and maximum timing characteristics of the circuit operating at 0.4V when a first delay segment of the selectable delay buffer 418 is selected. In this example, the $t_{hold}$ for the second flip flop is 4 ns and the maximum capture path time for the clock path is 15 ns. Thus, one delay buffer 418 with $t_{min}$ of 2 ns is used to set the minimum data arrival time in the data path to 19 ns to ensure correct circuit operation. As illustrated in FIG. 4B, the same circuit 400 operated at 0.5V may have different timing characteristics. In this example, the $t_{hold}$ for the second flip flop is 2 ns and the maximum capture path time for the clock path is 10.5 ns. The minimum data arrival time in the data path using the delay buffers 418 with the first delay segment selected would be 10.5 ns, which is not long enough. By using the second delay segment in the delay buffer 418, in this example, $t_{min}$ for the delay buffer increases to 3 ns and the minimum data arrival time in the data path using the delay buffer 418 with the second delay segment selected would be 12.5 ns. Thus, a potential hold violation is corrected at the higher 0.5V operating voltage level by using the second delay segment in the delay buffer 418.

Figure 5:
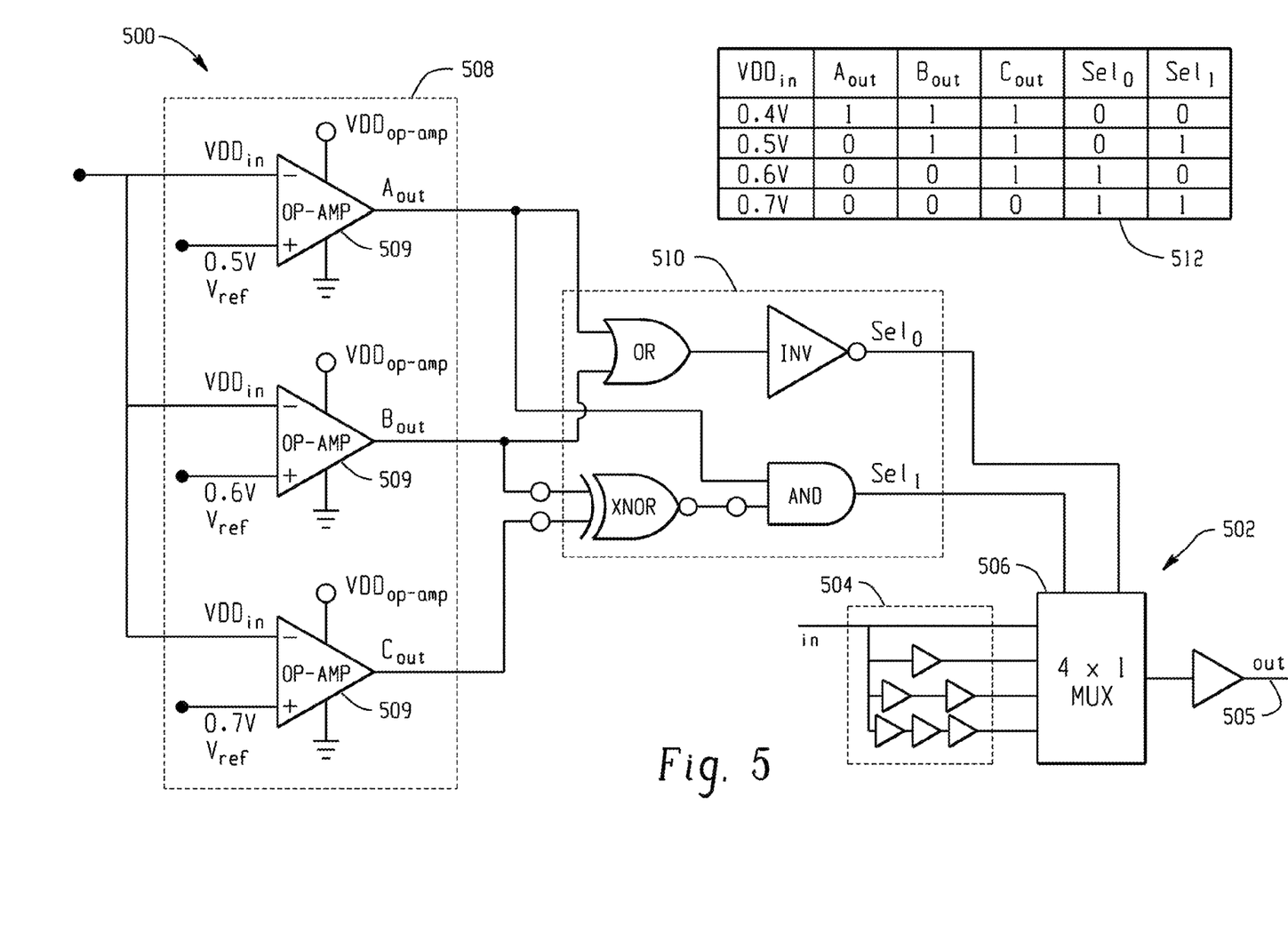
FIG. 5 is a schematic diagram of an example control signal generating circuit for generating control signals for choosing delay paths in a selectable delay buffer, in accordance with some embodiments.

FIG. 5 is a schematic diagram of an example control signal generating circuit 500 for generating control signals for choosing delay paths in a selectable delay buffer 510. The example selectable delay buffer 502 has a delay segment section 504 with four selectable delay segments for operation at four different operating voltages such as 0.4V, 0.5V, 0.6V, and 0.7V. Each delay segment is configured to pass an input signal to an output terminal 505 within a different range of time delays (i.e., $t_{min}$ and $t_{max}$). The example selectable delay buffer 502 also has a segment selection switch 506 that is configured to selectively couple the delay segments to the output terminal 505 based on selection information that indicates which delay segment to couple to the output terminal 505. The segment selection switch 506 in this example is a 4×1 multiplexer.

The example control signal generating circuit 500 includes a comparator circuit 508 and signal generator circuit 510. In this example, the comparator circuit 508 includes three op-amps utilized as comparators that compare the voltage level at a voltage source to a reference voltage. The signal generator circuit 510, in this example, uses combinational logic to generate selection information based on the comparison of the voltage source voltage level to the reference voltage levels. Also shown in FIG. 5 is a table that illustrates signals at various nodes during the generation of selection information.

Figure 6:
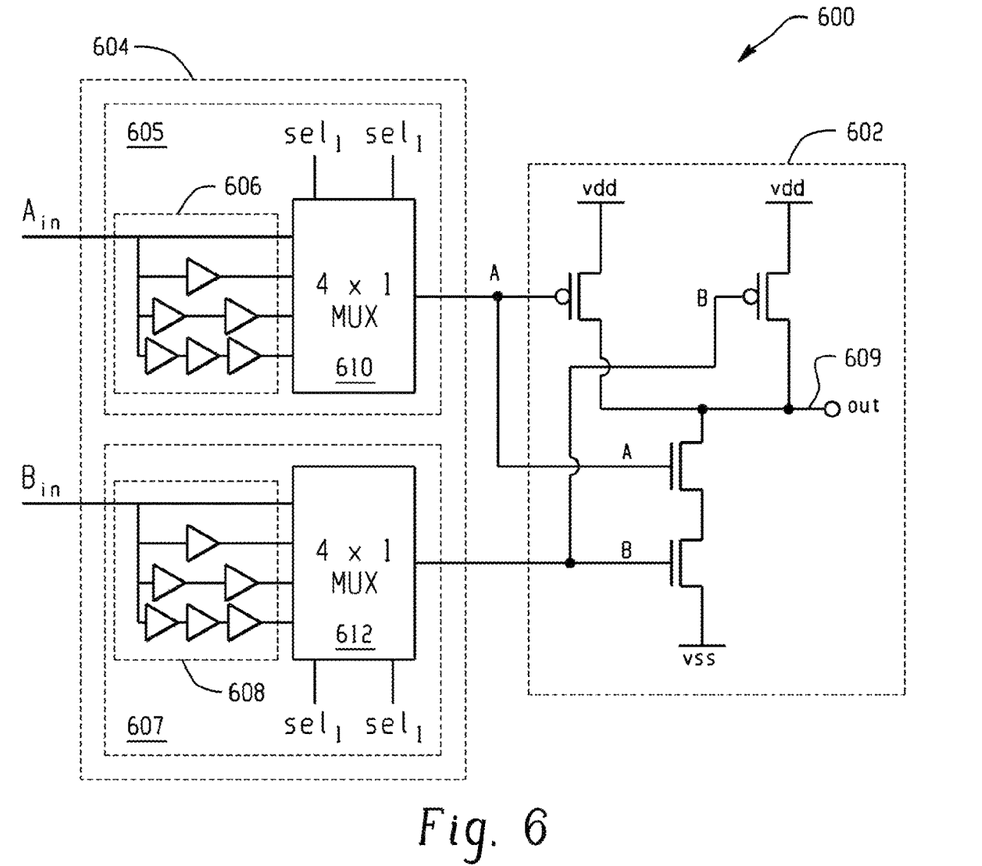
FIG. 6 is a schematic diagram of an example logic element that has been configured with selectable delays, in accordance with some embodiments.

FIG. 6 is a schematic diagram of an example logic element 600 that has been configured with selectable delays. A logic cell with selectable delays may be used for the same purpose as selectable delay buffers. The example logic element 600 is a selectable delay 2-input NAND gate that includes a logic section 602 and a selectable delay section 604. The selectable delay section 604 includes a first selectable delay buffer 605 and a second selectable delay buffer 607 wherein the first selectable delay buffer 605 is configured to provide a selectable delay for a first input signal A to the logic gate 602 and the second selectable delay buffer 607 is configured to provide a second selectable delay for a second input signal B to the logic gate 602.

The first selectable delay buffer 605 comprises a first delay segment section 606 with four selectable delay segments for operation at four different operating voltages such as 0.4V, 0.5V, 0.6V, and 0.7V. The second selectable delay buffer 607 comprises a second delay segment section 608 with four selectable delay segments for operation at four different operating voltages such as 0.4V, 0.5V, 0.6V, and 0.7V. Each delay segment is configured to pass an input signal to an output terminal 609 within a different range of time delays (i.e., $t_{min}$ and $t_{max}$).

The first selectable delay buffer 605 also comprises a first segment selection switch 610 that is configured to selectively couple the delay segments of the first delay segment section 606 to the output terminal 609 based on selection information that indicates which delay segment to couple to the output terminal 609. The second selectable delay buffer 607 also comprises a second segment selection switch 612 that is configured to selectively couple the delay segments of the second delay segment section 608 to the output terminal 609 based on selection information that indicates which delay segment to couple to the output terminal 609. Each segment selection switch 610, 612 in this example is a 4×1 multiplexer.

The first delay segment section 606 is coupled to the A input of the NAND gate and the second delay segment section 608 is coupled to the B input to delay the NAND gate output based on the selected delay segments. Although this example shows a selectable delay section 604 coupled to the NAND gate input, in another example a selectable delay section may be coupled to the NAND gate output.

Figure 7:
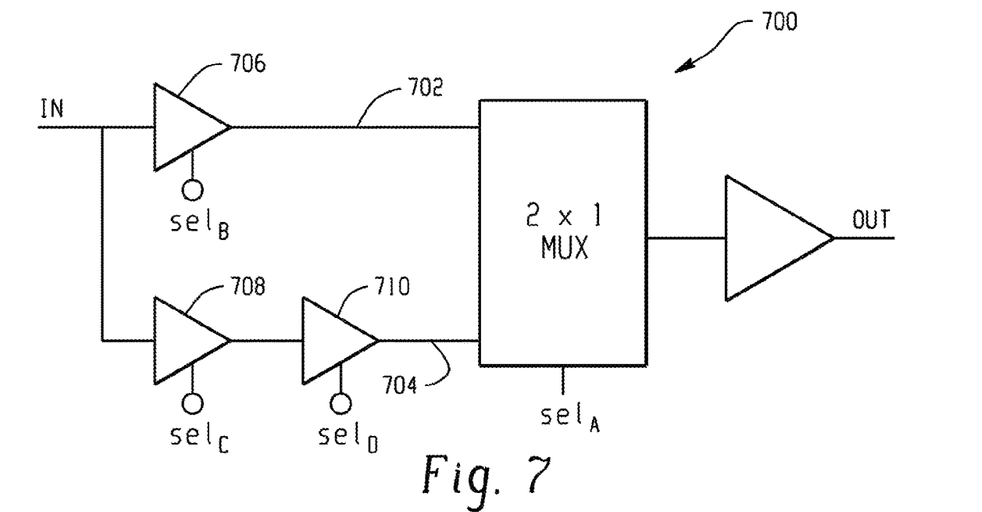
FIG. 7 is a schematic diagram of another example selectable delay buffer.

FIG. 7 is a schematic diagram of another example selectable delay buffer 700. The example selectable delay buffer 700 is configured with different types of selectable delay buffer elements in delay segments. In this example, the selectable delay buffer 700 includes a first delay segment 702 and a second delay segment 704. The first delay segment 702 includes a first delay buffer element 706. The second delay segment 704 includes a second delay buffer element 708 and a third delay buffer element 710.

Each of the buffer elements 706, 708, 710 includes multiple delay segments configured to delay an input signal based on selection information provided to a segment selection switch that is configured to selectively couple the delay segments to an output terminal. The example selectable delay buffer 700 may obtain a larger range of tunable delays by using different types of selectable delay buffer elements.

Figure 8:
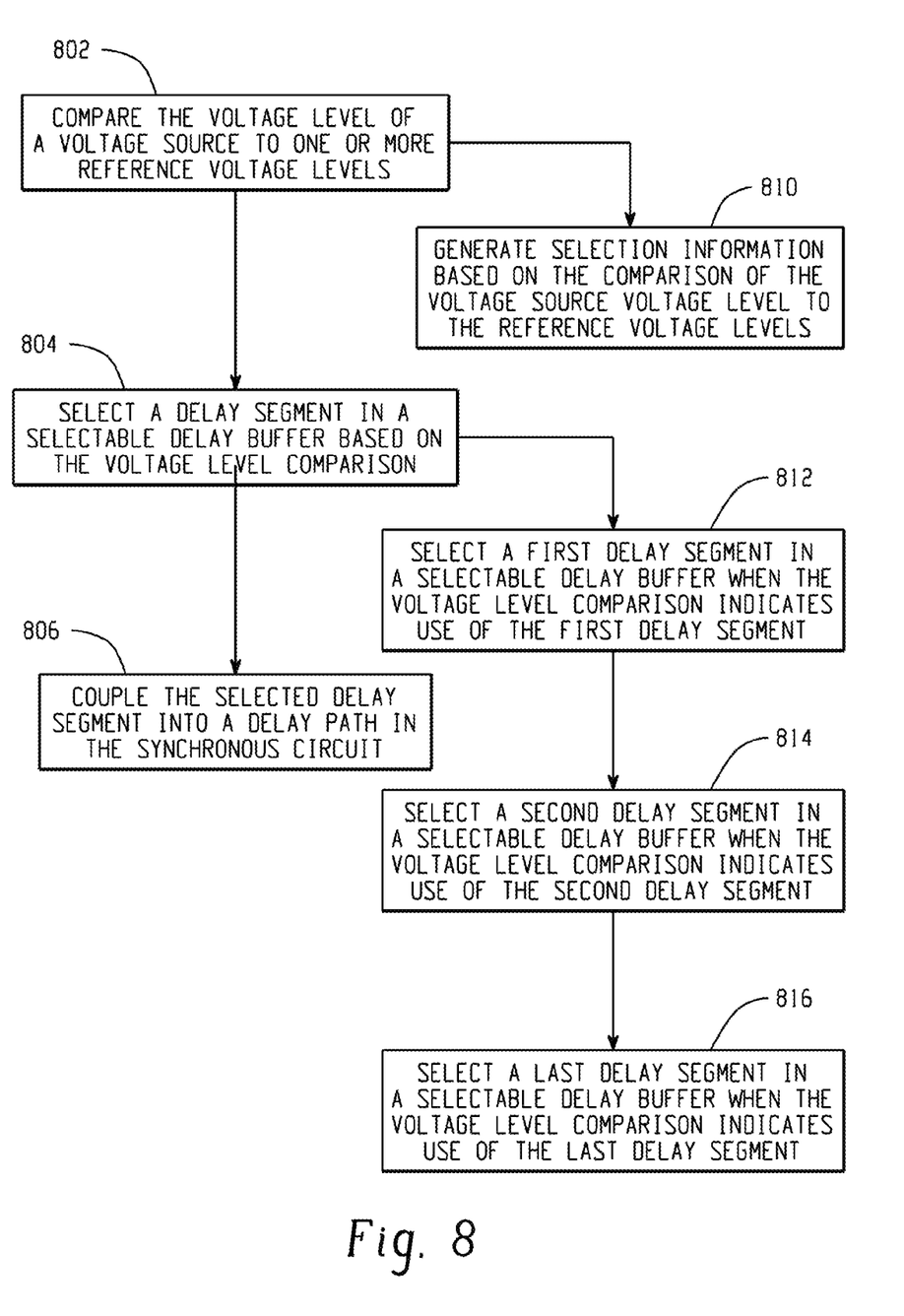
FIG. 8 is a process flow chart depicting an example method in a synchronous circuit for tuning a delay path, in accordance with some embodiments.

FIG. 8 is a process flow chart depicting an example method in a synchronous circuit having a selectable delay buffer for tuning a delay path in the synchronous circuit. The example method comprises comparing the voltage level of a voltage source to one or more reference voltage levels (operation 802). The example method further comprises selecting a delay segment in a selectable delay buffer (operation 804) and coupling the selected delay segment into a delay path in the synchronous circuit (operation 806).

Comparing the voltage level of a voltage source to one or more reference voltage levels may comprise generating selection information based on the comparison of the voltage source voltage level to the reference voltage levels (operation 810). Selecting a delay segment in a selectable delay buffer comprises selecting a first delay segment in a selectable delay buffer when the voltage level comparison indicates use of the first delay segment (operation 812), selecting a second delay segment in the selectable delay buffer when the voltage level comparison indicates use of the second delay segment (operation 814), and selecting a another delay segment (e.g., any additional delay segment including the final delay segment if additional delay segments exist) in the selectable delay buffer when the voltage level comparison indicates use of another delay segment (operation 816).

The delay path may be a data signal propagating path. The delay path may be a clock signal propagating path. The comparing the voltage level of a voltage source to one or more reference voltage levels may comprise using a comparator circuit comprising a plurality of operational amplifiers to compare the voltage level of the voltage source to the one or more reference voltage levels in a manner similar to that depicted in the example in FIG. 5. The selecting a first delay segment and the selecting a second delay segment may comprise using a multiplexer for the selecting in a manner similar to that depicted in the example in FIG. 5. The comparator circuit may be configured to generate one or more selection signals for use by the multiplexer for the selecting. This may be accomplished in a manner similar to that depicted in the example in FIG. 5.

Described herein are example delay buffers and other logic cells offering a range of selectable timing characteristics depending on the operating voltage of the design block. Also described is an example method of generating select control signals based on the operating voltage to choose the appropriate tunable delay path in the selectable buffers.

Although the foregoing examples illustrate that the delay path that is adjusted using the selectable delay buffers may be a data signal propagating path, the selectable delay buffers may also be used in a delay path that is a clock signal propagating path.

These examples illustrate the application of voltage selectable delay buffers and logic cells for ULV designs in a DVS environment, the ability to dynamically tune the delays of buffers and logic cells in max delay and min delay paths, the design of variable delay buffers and logic cells, and methods for generating control signals for selectable delay buffers. Advantages that may be realized from these examples include a higher maximum operating frequency when functioning at a higher operating voltage, reduced design effort to fix hold violations, and improved power performance area (PPA) for ULV designs for IoT/automotive products.

In one embodiment, disclosed is a selectable delay buffer for tuning a delay path in a circuit. The selectable delay buffer comprises a first delay segment configured to pass an input signal to an output terminal within a first range of time delays, a second delay segment configured to pass the input signal to the output terminal within a second range of time delays that is different from the first range, and a segment selection switch configured to selectively couple the delay segments to the output terminal based on received selection information that indicates which delay segment to couple to the output terminal.

These aspects and other embodiments may include one or more of the following features. The segment selection switch may comprise a multiplexer. The selectable delay buffer may further comprise one or more additional delay segments wherein each additional delay segment is configured to pass the input signal to the output terminal within a range of time delays that is different from the other range of time delays and wherein the segment selection switch is configured to selectively couple the additional delay segments to the output terminal based on the received selection information. The selection information may comprise two or more selection signals. The selectable delay buffer may further comprise a fixed delay section and an adjustable delay section comprising the first delay segment, the second delay segment, and the segment selection switch. The segment selection switch may be configured to select one of the delay segments when operating at a first voltage level and configured to select another of the delay segments when operating at a second voltage level. The selectable delay buffer may further comprise a selection information generating circuit wherein the selection information generating circuit comprises a comparator circuit for comparing the voltage level at a voltage source to a plurality of reference voltage levels, and a signal generator circuit for generating the selection information based on the comparison of the voltage source voltage level to the reference voltage levels. The comparator circuit may comprise a plurality of operational amplifiers and the signal generator circuit may comprise a plurality of logic cells.

In another embodiment, disclosed is a synchronous circuit that includes a logic gate configured to perform an operation on a data signal, a memory element that is configured to store the state of the operated-on data signal when triggered by a clock signal, and a selectable delay buffer for tuning a delay path in the synchronous circuit. The selectable delay buffer comprises a first delay segment configured to pass one of the clock signal or the data signal to an input of the memory element within a first range of time delays, a second delay segment configured to pass the one of the clock signal or the data signal to the input of the memory element within a second range of time delays that is different from the first range, and a segment selection switch configured to selectively couple the delay segments to the input of the memory element based on received selection information. The segment selection switch is configured to select the first delay segment to complete a delay path at a first supply voltage level and the segment selection switch is configured to select the second delay segment to complete the delay path at a second supply voltage level.

These aspects and other embodiments may include one or more of the following features. The memory element may comprise a flip flop. The delay path may be a data signal propagating path. The delay path may be a clock signal propagating path. The synchronous circuit may further comprise a selection information generating circuit. The selection information generating circuit may comprise a comparator circuit for comparing the voltage level at a voltage source to the first supply voltage level and the second supply voltage level and a signal generator circuit for generating the selection information based on the comparison of the voltage source voltage level to the first supply voltage level and the second supply voltage level. The comparator circuit may comprise a plurality of operational amplifiers. The signal generator circuit may comprise a plurality of logic cells.

In another embodiment, disclosed is a circuit for generating control information for a selectable delay element having a first delay segment configured to pass an input signal to an output terminal within a first range of time delays, a second delay segment configured to pass the input signal to the output terminal within a second range of time delays that is different from the first range, and a segment selection switch configured to selectively couple the delay segments to the output terminal based on selection information that indicates which delay segment to couple to the output terminal. The circuit comprises a comparator circuit for comparing the voltage level at a voltage source to a plurality of reference voltage levels and a signal generator circuit for generating selection information based on the comparison of the voltage source voltage level to the reference voltage levels.

These aspects and other embodiments may include one or more of the following features. The comparator circuit may comprise a plurality of operational amplifiers. The signal generator circuit may comprise a plurality of logic cells.

In another embodiment, disclosed is a logic element comprising a logic gate coupled to one or more selectable delay buffers. Each selectable delay buffer comprises a first delay segment configured to pass a digital signal to an output terminal within a first range of time delays, a second delay segment configured to pass the digital signal to the output terminal within a second range of time delays that is different from the first range, and a segment selection switch configured to selectively couple the delay segments to the output terminal based on received selection information that indicates which delay segment to couple to the output terminal.

These aspects and other embodiments may include one or more of the following features. The selectable delay buffers may comprise a first selectable delay buffer and a second selectable delay buffer wherein the first selectable delay buffer is configured to provide a selectable delay for a first input signal to the logic gate and the second selectable delay buffer is configured to provide a second selectable delay for a second input signal to the logic gate. Alternatively, the logic gate may provide the digital signal to the selectable delay buffer.

In another embodiment, disclosed is a logic cell with selectable delay paths comprising a logic gate, a first delay segment configured to pass a digital signal to an output terminal within a first range of time delays, a second delay segment configured to pass the digital signal to the output terminal within a second range of time delays that is different from the first range, and a segment selection switch configured to selectively couple the delay segments to the output terminal based on received selection information that indicates which delay segment to couple to the output terminal.

In yet another embodiment, disclosed is a selectable delay buffer for tuning a delay path in a circuit. The selectable delay buffer include a plurality of selectable delay buffer elements. Each selectable delay buffer element comprises a first delay segment configured to pass an input signal to a delay buffer element output terminal within a first range of time delays, a second delay segment configured to pass the input signal to the output terminal within a second range of time delays that is different from the first range, and a segment selection switch configured to selectively couple the delay segments to the output terminal based on received selection information that indicates which delay segment to couple to the output terminal.

These aspects and other embodiments may include one or more of the following features. The plurality of selectable delay buffer elements may comprise a first selectable delay buffer element in a first path that is parallel to a second path containing a second selectable delay buffer element, and a path selection switch configured to selectively couple the first path and the second path to a selectable delay buffer output terminal based on received selection information that indicates which of the first path or second path to couple to the selectable delay buffer output terminal. The plurality of selectable delay buffer elements may comprise a third selectable delay buffer element in series with the second selectable delay buffer element in the second path.

In another embodiment, disclosed is a method in a synchronous circuit having a selectable delay buffer for tuning a delay path in the synchronous circuit. The method comprises comparing the voltage level of a voltage source to one or more reference voltage levels, selecting a first delay segment in a selectable delay buffer when the voltage level comparison indicates use of the first delay segment, selecting a second delay segment in the selectable delay buffer when the voltage level comparison indicates use of the second delay segment, and coupling the selected delay segment into a delay path in the synchronous circuit.

These aspects and other embodiments may include one or more of the following features. The delay path may be a data signal propagating path. The delay path may be a clock signal propagating path. The comparing the voltage level of a voltage source to one or more reference voltage levels may comprise using a comparator circuit comprising a plurality of operational amplifiers to compare the voltage level of the voltage source to the one or more reference voltage levels. The selecting a first delay segment and the selecting a second delay segment may comprise using a multiplexer for the selecting. The comparator circuit may be configured to generate one or more selection signals for use by the multiplexer for the selecting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A selectable delay buffer for tuning a delay path in a circuit, comprising:
    at least two delay segments each configured to pass an input signal to an output terminal within at least two ranges of time delays that are different between each other; and
    a segment selection switch configured to selectively couple the delay segments to the output terminal based on received selection information generated using combinational logic comprising an XNOR gate that indicates which delay segment to couple to the output terminal.

2. The selectable delay buffer of claim 1, wherein the segment selection switch comprises a multiplexer.

3. The selectable delay buffer of claim 1, further comprising one or more additional delay segments wherein each additional delay segment is configured to pass the input signal to the output terminal within a range of time delays that is different from the other range of time delays and wherein the segment selection switch is configured to selectively couple the additional delay segments to the output terminal based on the received selection information.

4. The selectable delay buffer of claim 3, wherein the selection information comprises two or more selection signals.

5. The selectable delay buffer of claim 1, further comprising a fixed delay section and wherein the first delay segment, the second delay segment, and the segment selection switch form an adjustable delay section.

6. The selectable delay buffer of claim 1, wherein the segment selection switch is configured to select one of the delay segments when operating at a first voltage level and configured to select another of the delay segments when operating at a second voltage level.

7. The selectable delay buffer of claim 1, further comprising a selection information generating circuit, the selection information generating circuit comprising:
    a comparator circuit for comparing the voltage level at a voltage source to a plurality of reference voltage levels; and
    a signal generator circuit for generating the selection information based on the comparison of the voltage source voltage level to the reference voltage levels.

8. The selectable delay buffer of claim 7, wherein the comparator circuit comprises a plurality of operational amplifiers and wherein the signal generator circuit comprises a plurality of logic cells.

9. The selectable delay buffer of claim 7, wherein the signal generator circuit uses the XNOR gate.

10. A method, comprising:
    passing, using at least two delay segments, an input signal to an output terminal within at least two ranges of time delays that are different from each other; and
    selectively coupling, using a segment selection switch, the delay segments to the output terminal based on received selection information generated using combinational logic comprising an XNOR gate that indicates which delay segment to couple to the output terminal.

11. The method of claim 10, wherein the segment selection switch comprises a multiplexer.

12. The method of claim 10, further comprising:
    passing, using one or more additional delay segments, the input signal to the output terminal within a range of time delays that is different from the other range of time delays; and
    selectively coupling, using the segment selection switch, the additional delay segments to the output terminal based on the received selection information.

13. The method of claim 12, wherein the selection information comprises two or more selection signals.

14. The method of claim 10, wherein the first delay segment, the second delay segment, and the segment selection switch form an adjustable delay section.

15. The method of claim 10, further comprising selecting, using the segment selection switch, one of the delay segments when operating at a first voltage level and selecting another of the delay segments when operating at a second voltage level.

16. The method of claim 10, further comprising:
    comparing, using a comparator circuit of a selection information generating circuit, the voltage level at a voltage source to a plurality of reference voltage levels; and
    generating, using a signal generator circuit, the selection information based on the comparison of the voltage source voltage level to the reference voltage levels.

17. The method of claim 16, wherein the comparator circuit comprises a plurality of operational amplifiers and wherein the signal generator circuit comprises a plurality of logic cells.

18. The method of claim 16, wherein the signal generator circuit uses the XNOR gate.

19. A selectable delay buffer, comprising:
    at least two delay segments each configured to pass an input signal to an output signal within at least two ranges of time delays that are different between each other;
    a segment selection switch configured to selectively couple the delay segments to the output terminal based on received selection information generated using combinational logic comprising an XNOR gate that indicates which delay segment to couple to the output terminal; and
    a signal generator circuit for generating the selection information.

20. The selectable delay buffer of claim 19, further comprising:
    a comparator circuit for comparing a voltage level at a voltage source to a plurality of reference voltage levels, wherein the signal generator circuit for generating the selection information based on a comparison of the voltage level at the voltage source to the plurality of reference voltage levels, using the XNOR gate, wherein the segment comprises a multiplexer.

* * * * *